(12) United States Patent
von der Lühe et al.

(10) Patent No.: US 7,335,855 B2
(45) Date of Patent: Feb. 26, 2008

(54) ELECTRIC PCB HEATING COMPONENT, ELECTRONIC CIRCUIT BOARD AND HEATING METHOD

(75) Inventors: Friedrich von der Lühe, Discovery Bay (HK); William Muirhead, Chaiwan (HK)

(73) Assignee: DBK David + Baader GmbH (DE)

( * ) Notice: Subject to any disclaimer, the term of this patent is extended or adjusted under 35 U.S.C. 154(b) by 123 days.

(21) Appl. No.: 11/272,468

(22) Filed: Nov. 10, 2005

(65) Prior Publication Data

US 2006/0289464 A1    Dec. 28, 2006

(30) Foreign Application Priority Data

Nov. 11, 2004  (EP) ................................. 04026834

(51) Int. Cl.
*H05B 1/00* (2006.01)
*H01C 7/13* (2006.01)

(52) U.S. Cl. ...................... 219/201; 219/505; 219/520; 219/530; 219/536; 219/538; 219/540; 219/541; 219/542; 219/544; 219/546; 338/22 R; 338/23

(58) Field of Classification Search ............... 219/201, 219/505, 520, 530, 536, 538, 540–542, 544, 219/546; 338/22 R, 23, 220, 21
See application file for complete search history.

(56) References Cited

U.S. PATENT DOCUMENTS

| 4,352,008 | A | 9/1982 | Höfer et al. ................. 219/540 |
| 4,414,052 | A | 11/1983 | Habata et al. ............ 156/273.7 |
| 5,270,521 | A | 12/1993 | Shikama et al. ............. 219/530 |
| 5,691,688 | A * | 11/1997 | West et al. ................ 338/22 R |
| 6,114,674 | A | 9/2000 | Baugh et al. ................ 219/543 |
| 6,180,930 | B1 | 1/2001 | Wu .............................. 219/530 |
| 6,559,728 | B1 | 5/2003 | Fry .............................. 331/69 |
| 6,621,055 | B2 | 9/2003 | Weber et al. ................ 219/494 |
| 6,720,536 | B2 * | 4/2004 | Bohlender ................... 219/504 |
| 7,012,225 | B2 * | 3/2006 | Bohlender et al. .......... 219/536 |
| 2004/0104215 | A1 | 6/2004 | Starck et al. ................ 219/534 |

FOREIGN PATENT DOCUMENTS

| DE | 40 10 620 A1 | 10/1991 |
| EP | 0 371 644 A1 | 6/1990 |
| JP | 2000188171 | 7/2000 |
| JP | 2000315916 | 11/2000 |

\* cited by examiner

*Primary Examiner*—Shawntina Fuqua
(74) *Attorney, Agent, or Firm*—Seed Intellectual Property Law Group PLLC

(57) ABSTRACT

An electric PCB heating component for a heating electric component is coupleable to an electronic circuit board. The PCB heating component includes a fastening element, a heating element for generating thermal energy, and a heating body. The heating body emits thermal energy via a heat radiating surface. For a low cost PCB heating component, the heating element is a PTC heating element. A plurality of heating projections of the heating element cooperate to form a relatively large heat radiating surface such that thermal energy can be emitted in a substantially directional mode. The heating projections can be convection or radiation elements.

20 Claims, 10 Drawing Sheets

ELECTRIC PCB HEATING COMPONENT, ELECTRONIC CIRCUIT BOARD AND HEATING METHOD

BACKGROUND OF THE INVENTION

1. Technical Field

The invention in some embodiments generally relates to an electric PCB (printed circuit board) heating component for heating adjacent units and electric components arranged on an electronic circuit board, comprising at least one fastening element by which the PCB heating component is attachable to the electronic circuit board adjacent the other components, at least one heating element for generating thermal energy, and at least one heating body which emits via a heat radiating surface the thermal energy generated by the heating element when the PCB heating component is in operation, said thermal energy heating the electric components.

2. Description of the Related Art

One field of application of such PCB heating components is, e.g., in electric or electronic devices which are operated outdoor and/or under cold climatic conditions, e.g. transmitters for the cellular phone network, ticket vending machines or outdoor cameras. In order to avoid negative effects, e.g. longer response times or malfunctions, of the low ambient temperatures on the electric components arranged on an electronic circuit board or conductor board, the PCB heating component, which is used for heating the components to a predetermined temperature, is provided on the electronic circuit boards.

A further reason for the use of said electric PCB heating components is, e.g., a high humidity of the ambient air, which may result in an undesirable and possibly fault-causing condensation on the electric components. Such condensation is prevented by the above-mentioned PCB heating component which heats the components to a temperature above a condensation temperature.

Examples of such PCB heating components are described in JP 2000188171A, U.S. Pat. No. 6,114,674 and U.S. Pat. No. 6,621,055 B2. In the case of the PCB heating component described in JP 2000188171A two heating elements, which are arranged on an electronic circuit board, are heated in a temperature-dependent manner by an amplifier element. U.S. Pat. No. 6,114,674 and U.S. Pat. No. 6,621,055 B2 each describe electronic circuit boards having integrated therein a heating layer for heating the components arranged on the electronic circuit board.

Another field of use of the above-mentioned PCB heating component arises in connection with electric components which, when in operation, need a temperature which should be as constant as possible, such components being, e.g., oscillators.

Such PCB heating components for oscillators are described, e.g., in U.S. Pat. No. 6,559,728 B1 and JP 2000315916A. In U.S. Pat. No. 6,559,728 B1 an oscillator arranged in a case is heated by a heating element controlled by a control circuit. In JP 2000315916A a piezoelectric oscillator is described whose temperature is controlled by a PCB heating component including a control circuit.

BRIEF SUMMARY

The above-mentioned PCB heating components according to the prior art are disadvantageous insofar as the manufacturing costs are very high due to a large investment in material and a high assembly effort.

It is therefore the object of some embodiments of the present invention to provide a PCB heating component at low manufacturing costs.

In some embodiments, the heating element is implemented as a PTC heating element and that the heating body has arranged thereon one or a plurality of heating projections implemented as convection and radiation elements, which enlarge the heat radiating surface and by means of which the thermal energy can be emitted in a substantially directional mode.

This solution is particularly simple from the structural point of view and reduces the manufacturing costs of the PCB heating component insofar as the PTC heating element is implemented as a self-controlling element and does therefore not include any expensive control circuits, and insofar as, by means of the heating projections implemented as convection and radiation elements, thermal energy can be emitted to a plurality of components which are spaced-part from the PCB heating component.

When the PCB heating component is in operation, the heat radiating surface of the heating body, which is enlarged by the heating projections, emits thermal energy in a directional mode, either indirectly through convection via the ambient air or directly through heat radiation. This allows a contactless transfer of thermal energy to all the components to be heated on the electronic circuit board. The PCB heating component has comparatively small dimensions because it need not be in contact with the components to be heated. Due to the small overall size of the PCB heating component, the amount of material required and, consequently, the manufacturing costs will be reduced.

The PTC (positive temperature coefficient) heating element according to some embodiments of the present invention is self-controlling due to the properties of the material used for said element. A PTC heating element, a so-called PTC thermistor heating element, has the property of effectively heating within an adjustable range, when it is in operation, i.e. when electric energy flows therethrough. From a specific temperature onwards, the electric resistance of the PTC heating element increases in such a way that the heating element virtually stops heating. On the basis of this property, PTC heating elements are self-controlling and can therefore be operated without any additional expensive temperature control.

The electric PCB heating component which has been improved in this way can be further developed by various, independent embodiments which can be combined and each individual one of which is advantageous. These embodiments and the respective advantages resulting therefrom will be discussed briefly in the following.

The heating body can, for example, be implemented as an extrusion profile. This has the advantage that the extrusion profile can be mass-produced at a particularly reasonable price. Furthermore, extrusion profiles are characterized by a very good dimensional accuracy and surface quality, i.e. the heating body need not be further treated after the extrusion. In addition, the heating body can be produced from a material having a particularly good thermal conductivity, e.g. aluminium.

Additionally, the heating body can include a reception means in which the heating element is arranged. The heating element can in this way be positioned and oriented relative to the heating body in a particularly easy and quick mode when the PCB heating component is being assembled. This allows the PCB heating component according to the present invention to be assembled quickly. Furthermore, the heating element can be press-fitted in the reception means, which is implemented, e.g. in the form of a passage, so as to secure it in position. The press-fitting is a further guarantee for a good heat transfer between the heating element and the heating body. Alternatively, the heating element can also be secured in position in the reception means with the aid of a suitable adhesive having, e.g. a particularly good thermal conductivity. Furthermore, the heating element can be secured in position by potting it in the reception means with the aid of a thermally conductive potting or casting compound. On the basis of this embodiment inaccuracies in the surfaces of the heating element and/or the reception means can be compensated and larger, less-expensive shape and position tolerances of the reception means and of the heating element are possible. For simple manufacturing by means of extrusion, the reception means can be implemented in the heating body as a through-passage extending in the extrusion direction.

In order to be able to electrically insulate the heating element from its surroundings, electrically insulating closure members can be arranged in the ends of the reception means implemented as a through-passage. In addition, at least one of the closure members can electrically insulate the heating body in one direction and/or form a support surface of the PCB heating component.

The heating projections can be implemented such that they extend outwards, away from the heating body, substantially in a heating direction, in particular at right angles to the longitudinal axis, and parallel to one another, so as to be able to emit the thermal energy in a particularly effective and in a directional mode. The heating projections may have formed between them circulation passages through which an ambient gas, e.g. air, can flow so as to increase the convection when the PCB heating component is in operation.

In order to reduce the manufacturing costs of the PCB heating component according to the present invention and the effort which is necessary for mounting the same, the heating body can be formed integrally with an electrode body of the heating element.

In the case of this embodiment, the at least one heating body is attached directly to the PTC element. The contact surface of the heating body corresponds substantially to that of the PTC element so as to allow a good electrical and thermal flow between the heating body and the heating element. The heating body can be connected to the heating element, e.g., by an adhesive, a tensioning element or by soldering.

In order to reduce the effort which is necessary for installing the PCB heating component according to the present invention on the electronic circuit board, the fastening element can be embodied as an electric contact element which is implemented such that it can be electrically connected to an energy source so as to supply energy to the PCB heating component. This will have the effect that, when the PCB heating component is mounted on the electronic circuit board, it will be secured in position and connected to the electronic circuit board in an electrically conductive manner in one operating step, and this will lead to a particularly fast installation of the PCB heating component. The fastening element can be connected to the electronic circuit board, e.g., by a substance-to-substance bond, for example by means of soldering. Furthermore, the fastening element can be implemented as a plug connector which is adapted to be plugged into the electronic circuit board, e.g. into a complementary mating plug. This has the advantage that the fastening element can be connected to the electronic circuit board in a particularly fast and repeatedly detachable manner. The plug connector may be implemented as a standardized plug connector which is particularly inexpensive.

In order to reduce the cost of material and the assembly time of the PCB heating component according to some embodiments, the fastening element can be formed integrally with the electrode body of the heating element.

In accordance with another embodiment, a heating element which is to be heated by contact can be arranged in a thermally conductive manner on a contact heating surface formed on the PCB heating component. This has the advantage that, in addition to the heating of the spaced-apart components by the heating projections of the heating body, also the component which is to be heated by contact will be heated by the PCB heating component according to the present invention. The component arranged on the contact surface can be heated by thermal conduction within a particularly short period of time when the PCB heating component is in operation. Furthermore, the contact heating surface can be formed in a heating surface area and the heating projections can be formed in a heating projection area of the heating body. In addition, the component can be secured to the contact heating surface by a suitable fastening means, e.g. a screw.

In yet other embodiments, the limit temperature at which the electric resistance of the PTC element changes can depend on the material of the PTC element. This has the advantage that, depending on the various cases of use, different limit temperatures can be preset by varying the materials or the combinations of materials of the PTC element. For example, the limit temperature of a PTC element made of $BaTiO_3$ can be varied by an additional percentage of strontium or lead. The limit temperature will be reduced by a percentage of strontium and increased by a percentage of lead. On the basis of this embodiment, it is possible to preset, depending on the respective case of use, the temperature of the heating element at which said heating element will virtually stop to generate thermal energy. The PCB heating component according to the present invention can thus be employed for many different cases of use with different target temperatures.

The present invention relates, in addition to the above-explained electric PCB heating component and the embodiments thereof, also to an electronic circuit board comprising at least one electric PCB heating component and other electric components, said PCB heating component being configured to heat the other components and being attached by means of a fastening element to the electronic circuit board adjacent the other components. In order to reduce the manufacturing costs of the electronic circuit board according to the present invention, the PCB heating component implemented according to one of the above-mentioned claims is arranged on the electronic circuit board in such a way that, when it is in operation, the thermal energy generated by the PCB heating component is transferred, either directly through heat radiation or indirectly through convection via an ambient gas, e.g. air, to the components spaced apart from the PCB heating component.

According to some embodiments of the electronic circuit board, the PCB heating component can be implemented as a premountable separate structural unit. The PCB heating component can thus be assembled and produced independently of the electronic circuit board, whereby the assembly time of the electronic circuit board will be reduced.

The present invention relates, in addition to the above-described PCB heating component and the electronic circuit board with its additional embodiments, also to a method of heating electric components arranged on an electronic circuit board by means of a PCB heating component, which is arranged on said electronic circuit board and which includes a heating element and a heating body, said method comprising the steps of generating thermal energy by means of the heating element, transferring said thermal energy to the heating body and transferring it, indirectly through convection via an ambient gas, e.g. air, and/or directly through heat radiation, from the heating projections of the heating body to the components to be heated.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles may not be drawn to scale, and some of these elements may be arbitrarily enlarged and positioned to improve drawing legibility. The various features can be combined independently of one another, as has already been explained hereinbefore in connection with the individual advantageous embodiments.

DETAILED DESCRIPTION OF EMBODIMENTS

To begin with, the general structural design of an electric PCB (printed circuit board) heating component will be described with reference to FIGS. 1 and 2.

Figure 1:
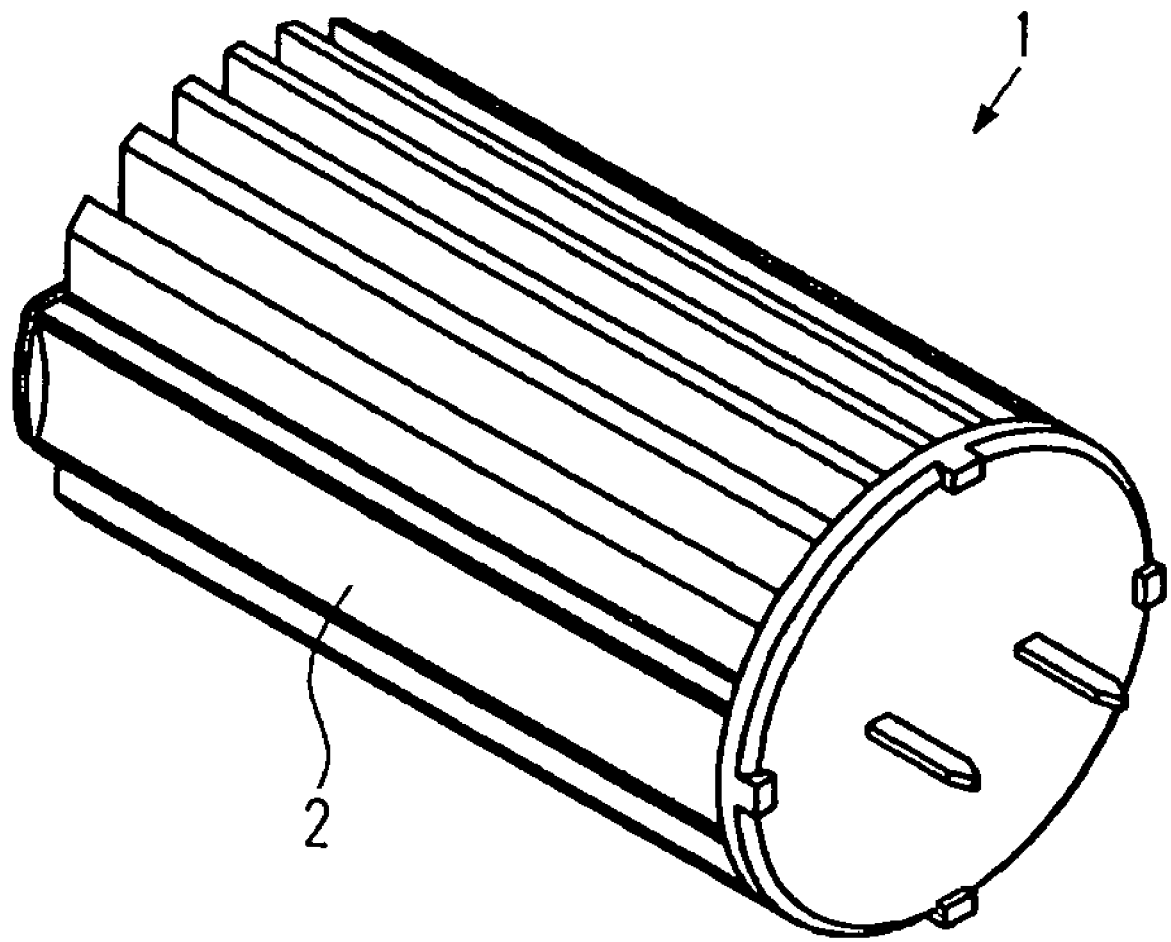
FIG. 1 shows, in a schematic perspective view, an embodiment of the PCB heating component.
Figure 2:
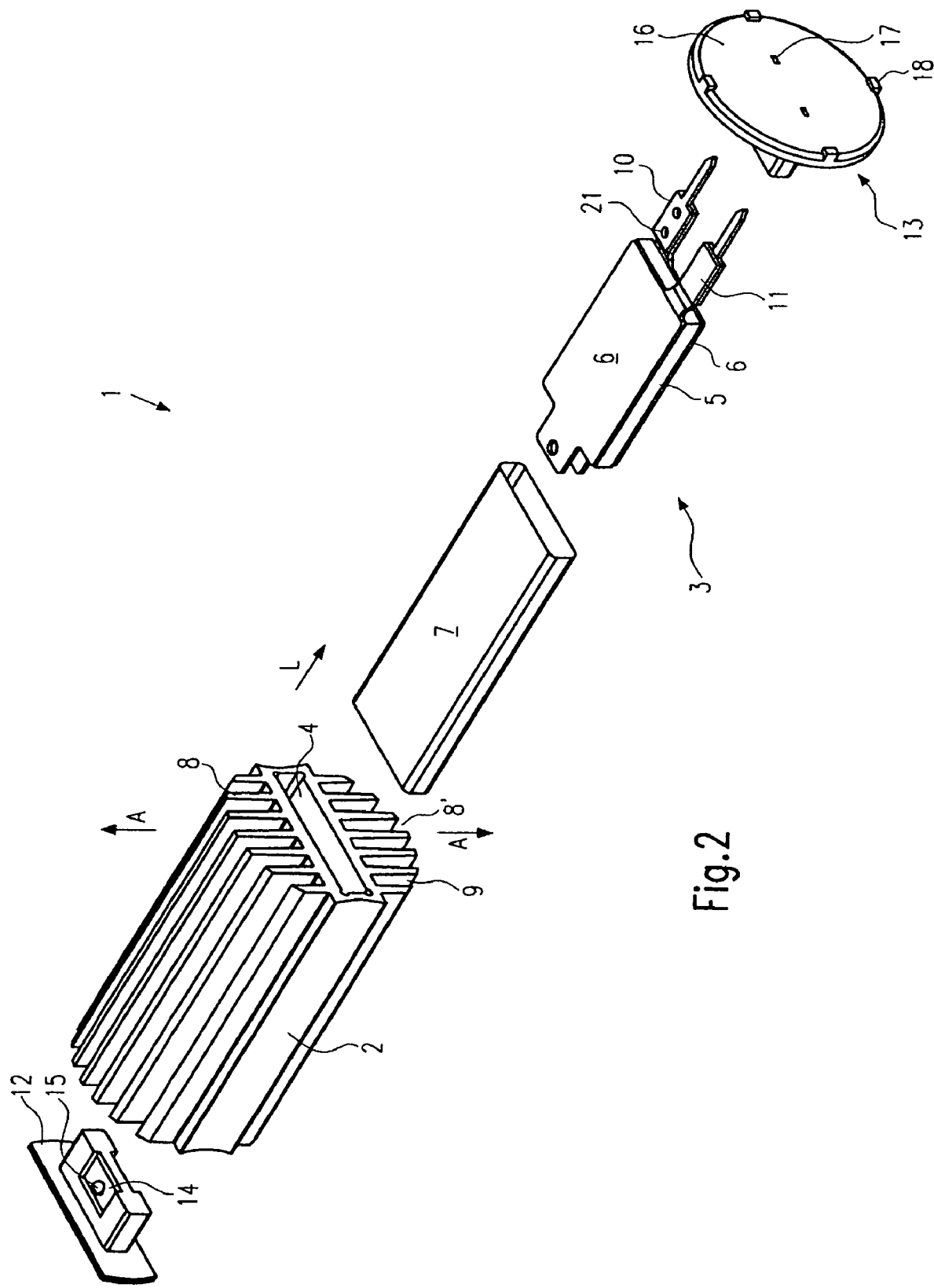
FIG. 2 shows, in a schematic exploded view, the PCB heating component of FIG. 1.

FIGS. 1 and 2 show a first exemplary embodiment of the electric PCB heating component 1 according to the present invention, comprising a heating body 2 and a heating element 3. The heating body 2 has formed therein a receiving section or reception means 4 which is implemented as a passage and in which the heating element 3 is arranged.

In the embodiment shown in FIGS. 1 and 2, the heating element 3 comprises at least one PTC element or PTC component 5, two electrode bodies 6 and an insulating element 7. The heating element 3 is implemented as a stack in which the PTC element 5 is arranged between the two plate-shaped electrode bodies 6. The insulating element 7, which is implemented as a tube-shaped foil, encompasses the PTC element 5 and the electrode bodies 6. In the exemplary embodiment shown in FIG. 2, the heating element 3 comprises one PTC element 5. Alternatively, the heating element 3 may also comprise a plurality of PTC elements 5.

Figure 4:
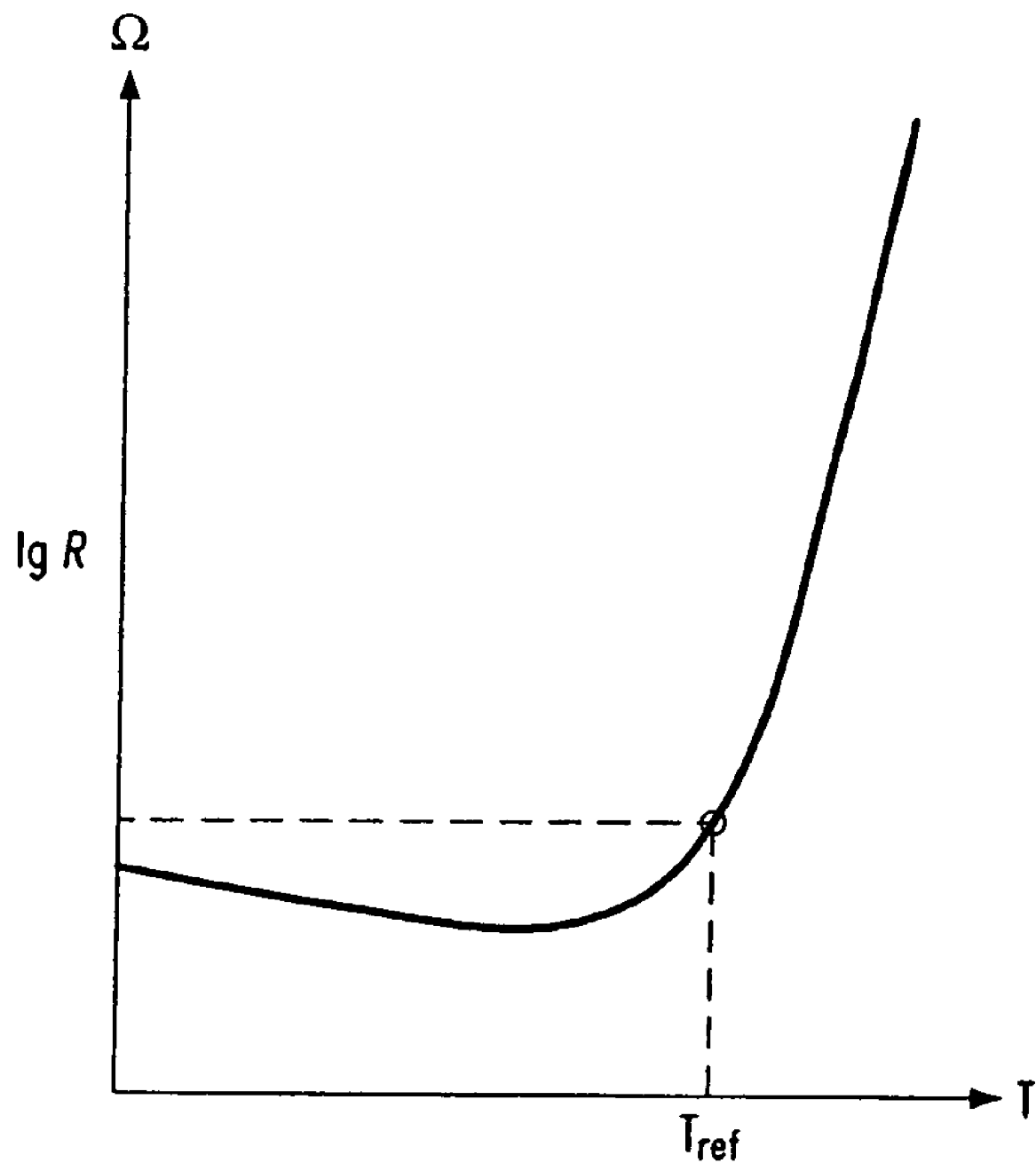
FIG. 4 shows an exemplary temperature-resistance diagram of a PTC element.
Figure 5:
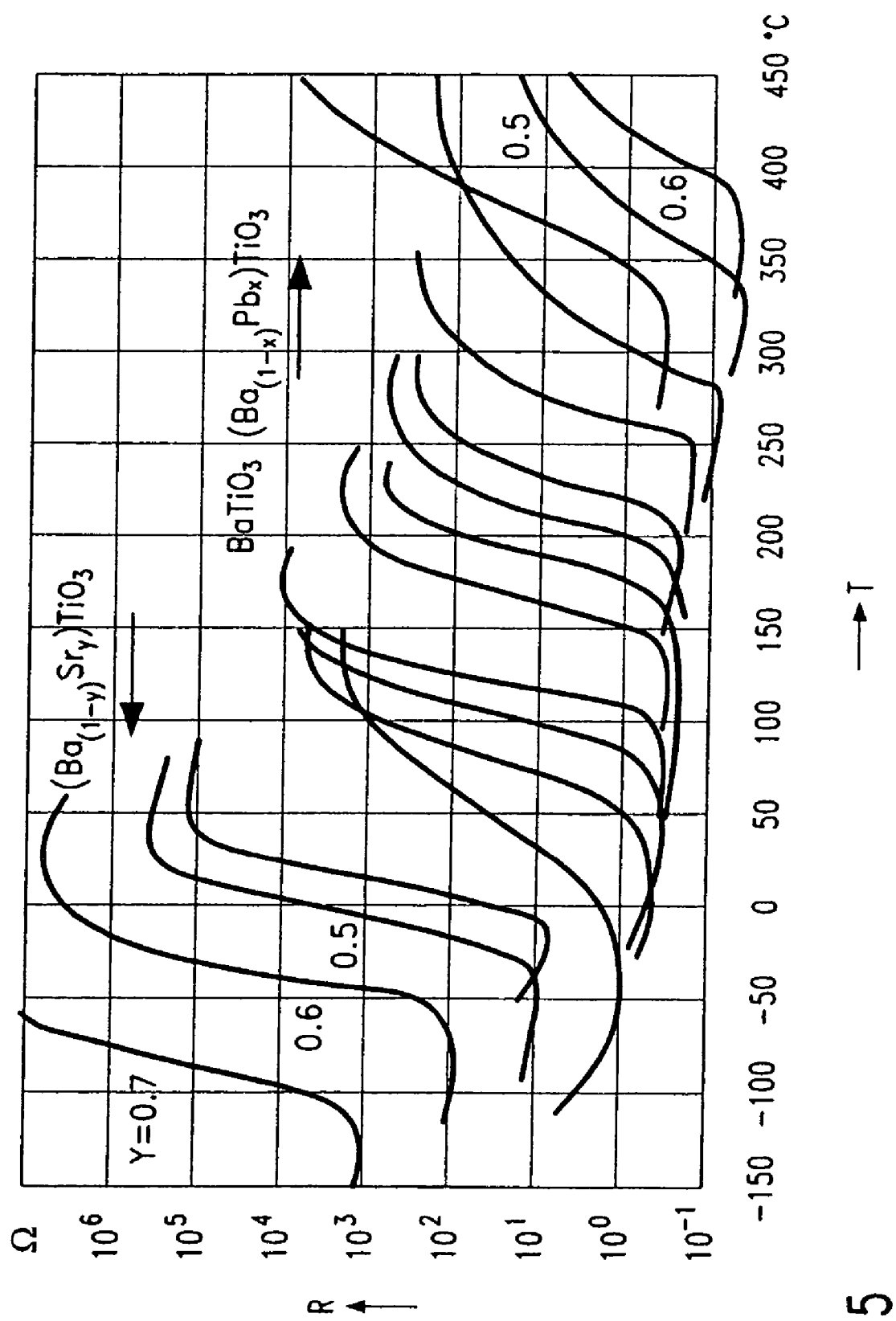
FIG. 5 shows a diagram with various exemplary temperature-resistance characteristics of PTC elements made of $BaTiO_3$ and containing different percentages of Sr or Pb components.

The at least one PTC (positive temperature coefficient) element 5, a so-called PTC thermistor, increases its electric resistance abruptly approximately from a limit temperature $T_{ref}$ onwards. This resistance-temperature characteristic is exemplarily shown in FIG. 4. Below the limit temperature $T_{ref}$ the PTC element 5 has a comparatively low electric resistance. For temperatures higher than the limit temperature $T_{ref}$, the electric resistance R increases, as shown in FIG. 4, and the PTC element 5 generates thermal energy at its operating point. The operating point (not shown) lies above the limit temperature $T_{ref}$ and is reached when there is an equilibrium between the thermal energy generated and the thermal energy emitted. The limit temperature $T_{ref}$ depends on the material of the PTC element. Different PTC elements 5 with different limit temperatures $T_{ref}$ can be produced for different cases of use. The PTC element is implemented e.g. as a ceramic element made of $BaTiO_3$. When the PTC element 5 is produced from $BaTiO_3$, the limit temperature can be reduced by an additional percentage of strontium and increased by an additional percentage of lead. FIG. 5 shows various resistance-temperature curves of PTC elements 5, which are produced from $BaTiO_3$ and which comprise different percentages of Sr and Pb, respectively.

When the PCB heating component 1 is in operation, the electrode bodies 6 introduce electric energy into the PTC element 5, whereby the heating element 3 will generate thermal energy. The electrode bodies 6 are implemented as contact plates and produced from a material having a high thermal conductivity as well as electrical conductivity, such as copper or aluminium.

The insulating element 7 insulates the sandwich comprising the at least one PTC element 5 and the electrode bodies 6 in the direction of the heating body 2. In order to guarantee good thermal conduction from the PTC element 5 and the electrode bodies 6 to the heating body 2, said insulating element 7 is produced from a material having a particularly good thermal conductivity. In the exemplary embodiment of FIGS. 1 and 2, the insulating element 7 is produced from a polyimide foil, in particular a Kapton foil. The Kapton foil has the advantage that it has a particularly good thermal conductivity, that it is electrically insulating and, in addition, pressure resistant, so that it will be able to transmit, should the situation arise, a pretension to the electrode bodies 6. The insulating element 7 shown in FIG. 2 is implemented as a hose into which the PTC element 5 and the electrode bodies 6 can be inserted quickly when the PCB heating component is being assembled. The hose-shaped insulating element 7 can be sealed, e.g. fused, at the ends thereof after insertion of the stack comprising the PTC element 5 and the electrode bodies 6.

In order to achieve a good heat transfer and in order to hold the at least one heating element 3 and the heating body 2 reliably together, the heating element 3 is press-fitted in the reception means 4 of the heating body 2 in the embodiment shown in FIGS. 1 and 2. During such press-fitting, the reception means 4, into which the heating element 3 has been inserted, is deformed in cross-section. This can be done, e.g., by a pair of tongs applied to the heating body 2 from outside or by some other pressure-application means. Alternatively to press-fitting, the heating element 3 may also be secured in position in the reception means 4 by an adhesive or a potting compound. The adhesive and the potting compound are here implemented such that they are particularly thermally conductive. Potting of the heating element 3 has the advantage that the potting compound can compensate inaccuracies, e.g. scratches, in the heating-element and/or reception-means surfaces so that no heat-insulating air inclusion will be caused.

In the embodiment shown in FIGS. 1 and 2, the reception means 4 is implemented as a through-passage in the heating body 2.

In addition to the reception means 4, which has already been described, the heating body 2 comprises a plurality of heating projections 8 extending in a longitudinal direction L and arranged substantially parallel to one another. The heating projections 8 are implemented as plates which stand on edge and extend away from the heating body 2 generally at right angles. The length of the heating projections 8 in said longitudinal direction L corresponds generally to the length of the rest of the heating body 2. The length of the heating projections 8 in a direction transversely to said longitudinal direction L decreases, especially in the case of the embodiment shown in FIGS. 1 and 2, towards the sides of the heating body. When the heating body 2 is seen in a cross-sectional view, the heating projection ends extending away from the heating body 2 are generally located on a circular path. Circulation passages 8' are formed between the heating projections 8.

The thermal energy generated by the heating element 3 when the PCB heating component 1 is in operation is conducted to the heating body 2. The outer surface of the heating body 2 is a heat radiating surface 9 from which the thermal energy is radiated outwards. In order to make the outer surface 9 and the possible heat emission of the heating body 2 as large as possible, the heating projections 8 are provided on the heating body 2. The heating projections 8 are implemented as convection-type and radiation elements. The thermal energy generated when the PCB heating component 1 is in operation is emitted by the heating projections 8 in a heating direction A extending essentially in the direction of the heating projections 8 that extend away from the heating element 3. Furthermore, the generated thermal energy is emitted by the heating body 2 essentially in the heating direction A through convection via the ambient air. The ambient air flows around the heat radiating surface 9 of the heating body 2 in the circulation passages 8'. In the circulation passages 8', which have a substantially U-shaped cross-section, the ambient air is heated in a particularly short period of time. The heated ambient air is conducted in the heating direction A away from the heating body 2 by means of the heating projections 8.

The heating body 2 shown in FIGS. 1 and 2 is implemented as an extrusion profile and can therefore be mass-produced at a reasonable price. The extrusion profile has the additional advantage that it can be produced with special dimensional accuracy and with a high surface quality and that the heating body 2 need not be further treated after the extrusion. In order to allow the reception means 4 and the heating projections 8 to be formed in one operating step during the extrusion process, they extend in the longitudinal direction L of the heating body 2, which is also the extrusion direction.

Two fastening elements 10 are arranged substantially parallel to one another at one end in the longitudinal direction L of the electric PCB heating component 1. In FIG. 2, the fastening elements 10 are especially connected to a respective one of the two electrode bodies 6. At the end extending away from the heating element 3, the fastening elements 10 are implemented as tapering flat plug connectors.

Making use of the fastening elements 10, the PCB heating component 1 can be attached to an electronic circuit board, as will be described in detail hereinbelow. The fastening elements 10 are produced from an electrically conductive material and implemented as contact elements of the electrode bodies 6 through which the PCB heating component 1 can be connected to a source of electric energy. In the embodiment shown in FIG. 2, the fastening elements 10 are especially connected to contact plates 11 of the electrode bodies 6 by means of rivets 21. It goes without saying that the fastening elements 10 can be connected to the electrode bodies 6 also by other fastening means, such as screws or bolts, or, e.g., by means of an adhesive. Alternatively, the fastening elements 10 may also be formed integrally with the electrode bodies 6.

In the assembled state of the electric PCB heating component 1 according to FIGS. 1 and 2, an upper and a lower closure member 12, 13 are inserted into respective end openings of the reception means 4, which is implemented as a through-passage. The upper closure member 12, which is T-shaped in cross-section, is provided with two pockets 14 and a detent means 15. The lower closure member 13, which is also T-shaped in cross-section, has a circular base 16. Said circular base 16 has formed therein two openings 17 and a plurality of fixing elements 18.

By means of the closure members 12, 13, the reception means 4 is closed and the heating element is electrically insulated from its surroundings. The closure members 12, 13 are produced from an electrically insulating material, e.g. a plastic material.

The pockets 14 of the upper closure member 12 are formed such that a respective electrode body 6 of the heating element 3 can be arranged in said pockets 14. The detent means 15 is adapted to be brought into locking engagement with a counterdetent on the electrode body 6, e.g. a hole, whereby the upper closure member 12 is secured in position.

The diameter of the circular base 16 of the lower closure member 13 is substantially equal to the outer diameter of the heating body 2 of the embodiment shown in FIGS. 1 and 2. In the assembled condition, the fastening elements 10 extend through the openings 17. By means of the circular base 16, one end of the heating body 2 is insulated electrically and thermally from its surroundings in the longitudinal direction L. The base 16 is the support surface with which the PCB heating component 1 can be arranged on the electronic circuit board. The fixing elements 18 secure the PCB heating component 1 against rotation relative to the electronic circuit board, when said PCB heating component 1 has been arranged on said electronic circuit board.

Figure 3:
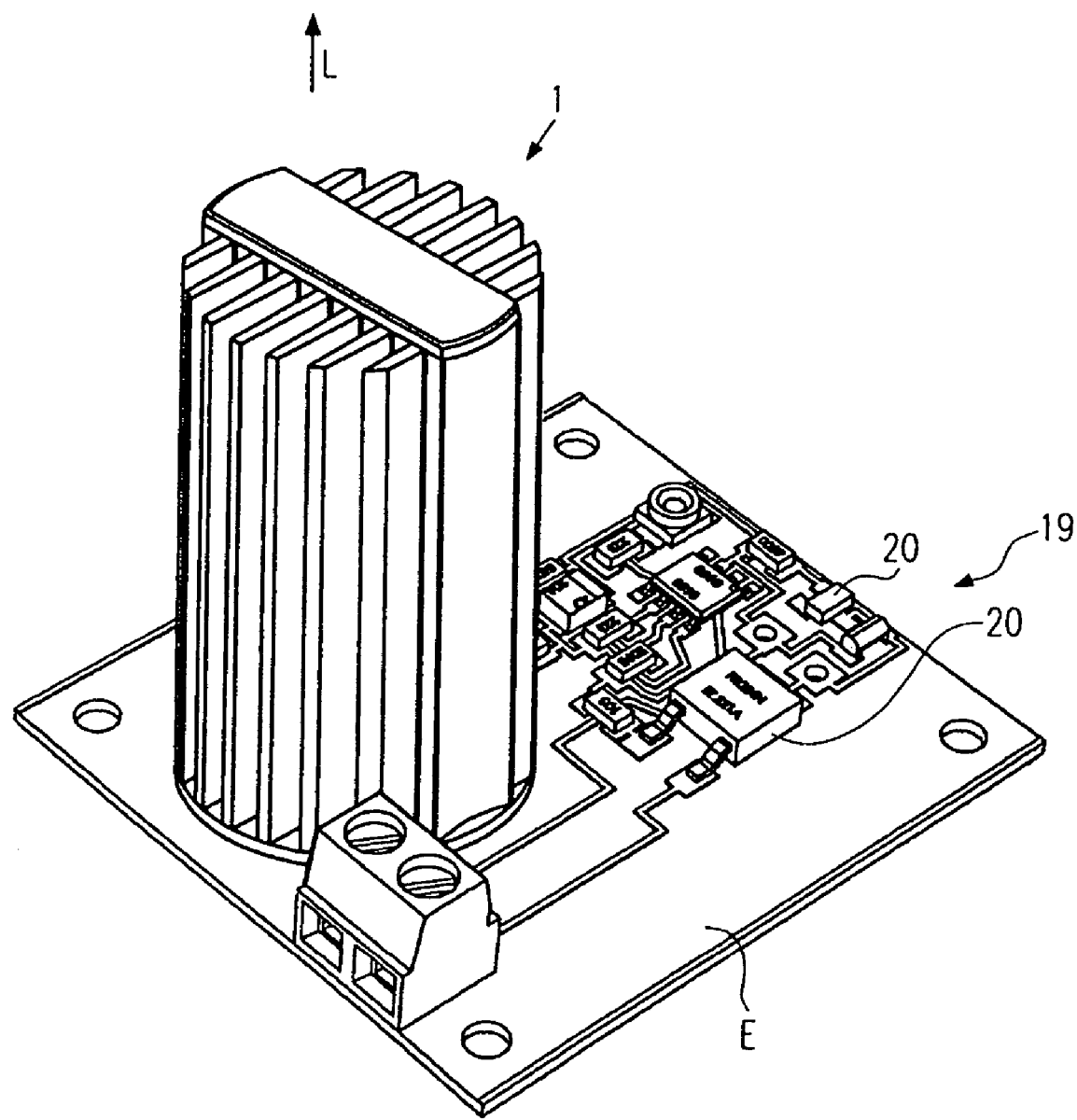
FIG. 3 shows, in a schematic perspective view, an electronic circuit board with the PCB heating component of FIG. 1.

FIG. 3 shows a first embodiment of an electronic circuit board 19 according to the present invention, said electronic circuit board 19 having arranged thereon electric components 20, such as capacitors, resistors, transistors or ICs (integrated circuits) and the PCB heating component 1 of FIGS. 1 and 2. The electric components 20 are arranged on the electronic circuit board 19 in spaced relationship with the PCB heating component 1. The longitudinal direction L of the PCB heating component 1 extends substantially perpendicular to the plane E of the electronic circuit board 19. The heating projections 8 extend away from the heating body 2 essentially transversely to the longitudinal direction L. The base 16 of the lower closure member 13, which extends parallel to the circuit board plane E, rests on the electronic circuit board 19.

The PCB heating component 1 is connected to the electronic circuit board 19 in an electrically conductive manner by means of the fastening elements 10 shown in FIGS. 1 and 2. When the electronic circuit board 19 is in operation, the PCB heating component 1 heats the electric components 20 arranged on the electronic circuit board 19. The PCB heating component 1 is arranged on the electronic circuit board 19 in such a way that the thermal energy generated by the heating element will be emitted by the heating body 2 through heat radiation and convection via the ambient air in the heating direction A, and heat the electric components 20. It follows that all the electric components arranged on the electronic circuit board 19 can be heated in a contactless manner by the PCB heating component 1. Furthermore, also other structural units, which are not arranged on the electronic circuit board 19, can be heated by the PCB heating component 1 through convection or heat radiation.

For heating the electric components 20, the electric energy is conducted from the electronic circuit board 19 to the fastening elements 10. The electric energy is introduced via the fastening elements 10 into the heating element 3, which converts the electric energy into thermal energy. The produced thermal energy is conducted by the heating element to the heating body 2. The heating body 2 transfers the thermal energy from its heating projections 8 to the electric components 20 either indirectly through convection via the ambient air, which transports the thermal energy towards the electric components 20, or directly through heat radiation. When the PCB heating component 1, a separate temperature control can be dispensed with, since the PTC heating element 3 is self-controlling, whereby overheating of the components 20 will be prevented.

Figure 6:
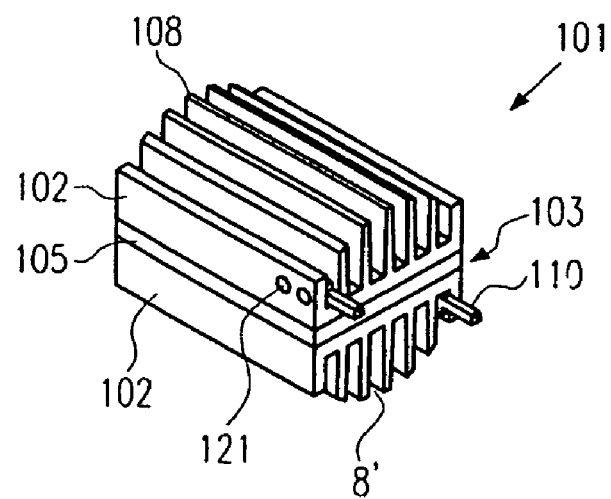
FIG. 6 shows a schematic representation of an embodiment of an electric PCB heating component.
Figure 7:
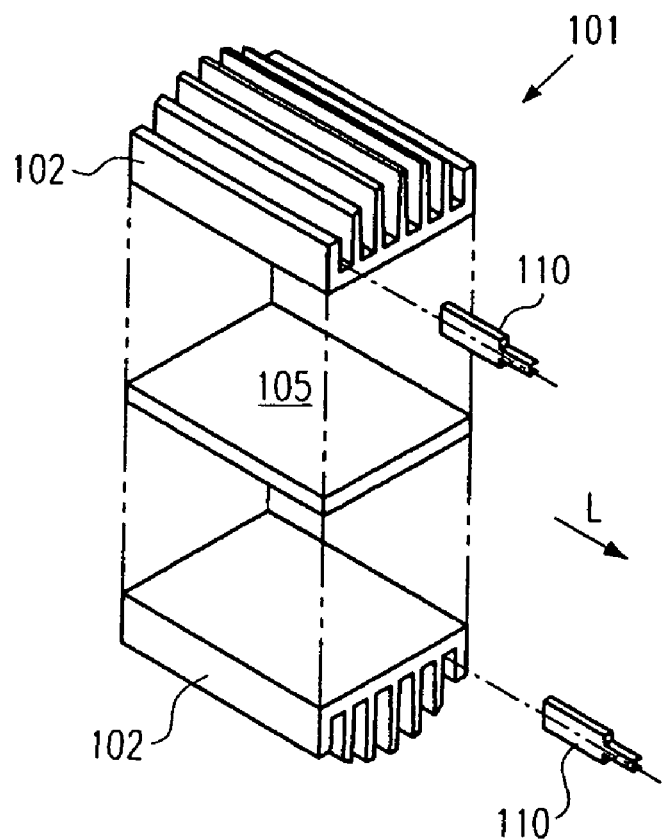
FIG. 7 shows, in a schematic exploded view, the electric PCB heating component of FIG. 6.

FIGS. 6 and 7 show another exemplary embodiment of the electric PCB heating component 101. In the following, only the differences existing in comparison with the embodiment according to FIGS. 1 and 2 will be dealt with.

Other than the embodiment according to FIGS. 1 and 2, the embodiment of FIGS. 6 and 7 comprises two separate heating bodies 102. The heating element 103 is arranged between these two heating bodies 102, which have essentially the same structural design. Similar to the embodiment according to FIGS. 1 and 2, each heating body 102 has arranged thereon heating projections 108 which extend away from the heating body 102 generally transversely to the longitudinal direction L.

The heating element 103 of the embodiment shown in FIGS. 6 and 7 comprises a PTC element 105, which is arranged between the heating bodies 102.

In the embodiment of FIGS. 6 and 7, energy is introduced into the PTC element 105 especially via the two heating bodies 102, which are implemented as electrode bodies of the heating element 103. The stack comprising the PTC element 105 and the two heating bodies 102 are stuck together by means of a suitable adhesive in the embodiment shown in FIGS. 6 and 7. In order to guarantee a good flow of heat from the PTC element 105 to the two heating bodies 102, the adhesive used has a good thermal conductivity. Furthermore, the contact surfaces of the heating body 102 and of the PTC element 105 are implemented such that they are substantially equal in area and planar; this has the effect that said contact surfaces lie on top of one another with good thermal conductivity and essentially without any interstices or air gaps. Alternatively to the adhesive joint, the heating bodies 102 and the PTC element 105 can also be pressed together by a clamping element or connected by soldering.

The fastening elements 110 are attached to one of the heating projections 108 of the two heating bodies 102 with the aid of fastening means, said fastening means being especially rivets 121 in the case of in the embodiment shown in FIGS. 6 and 7. Alternatively, the fastening elements 110 and the heating bodies 102 may also be crimped together by deformation of said fastening elements 110 or they may be formed as integral components. Similar to the embodiment in FIGS. 1 and 2, the PCB heating component 101 of FIGS. 6 and 7 can also be connected to an energy source by means of the fastening elements 110.

The PCB heating component 101 of FIGS. 6 and 7 comprises, in comparison with the embodiment shown in FIGS. 1 and 2, a smaller number of individual parts and it can be produced at lower manufacturing costs. Since the heating bodies 102 of the embodiment shown in FIGS. 6 and 7 are live when the PCB heating component 101 is in operation, this embodiment is particularly suitable for use on electronic circuit boards which are out of human reach.

Figure 8:
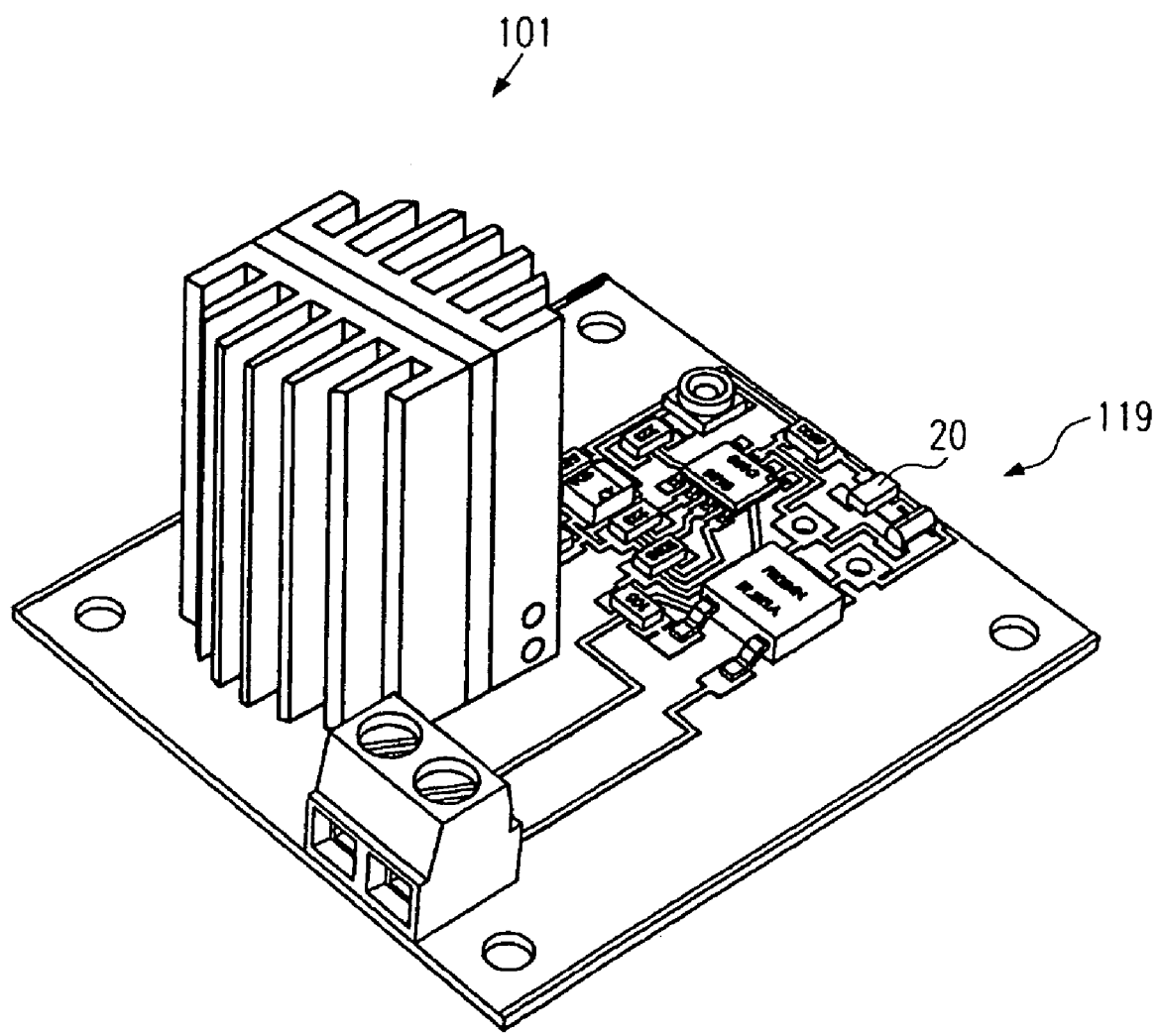
FIG. 8 shows, in a schematic perspective view, an electronic circuit board with the PCB heating component of FIG. 6.

FIG. 8 shows another exemplary embodiment of the electronic circuit board 119, which has the PCB heating component 101 according to FIGS. 6 and 7 arranged thereon.

The embodiment shown in FIG. 8 can be similar or identical to the embodiment shown in FIG. 3.

Figure 9:
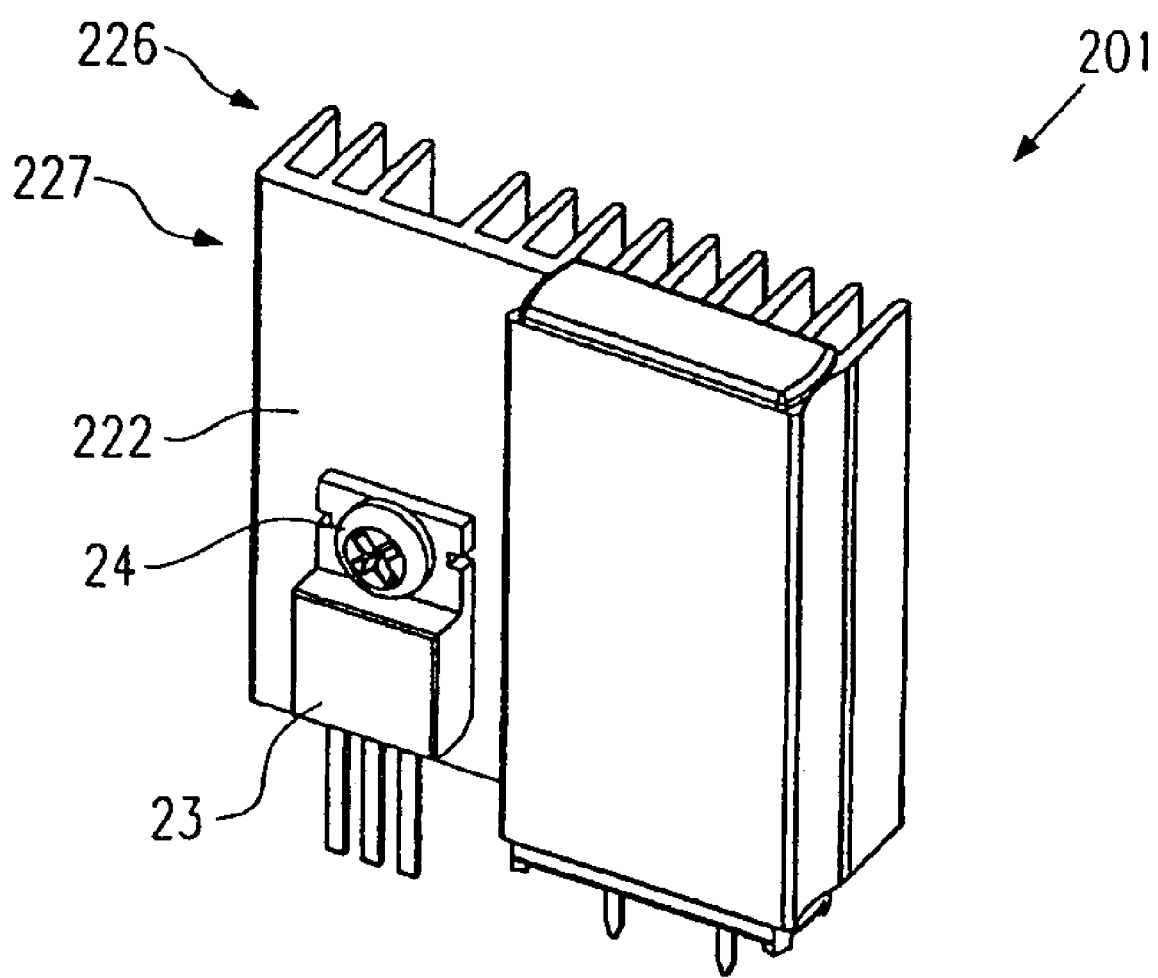
FIG. 9 shows, in a schematic perspective view, a PCB heating component according to another embodiment.
Figure 10:
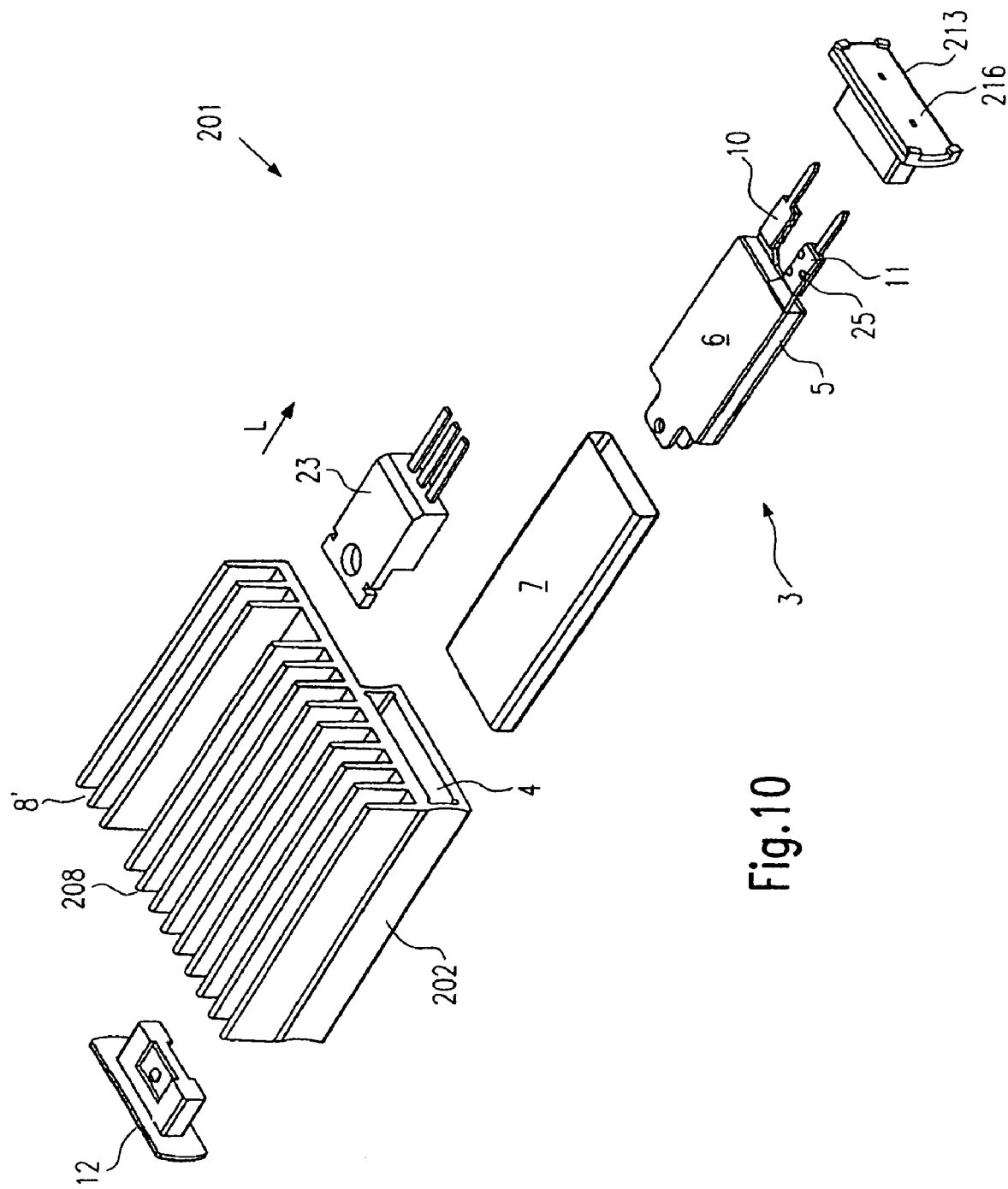
FIG. 10 shows, in a schematic exploded view, a PCB heating component of FIG. 9.

FIGS. 9 and 10 show another exemplary embodiment of the PCB heating component 201 according to the present invention. In the following, only the differences existing in comparison with the embodiment shown in FIGS. 1 and 2 will be dealt with.

In the embodiment shown in FIGS. 9 and 10, the heating body 202 is provided with heating projections 208 on only one side of the reception means 4. The individual heating projections 208 have substantially the same structural design, they are arranged in a heating projection area 226 of the heating body 2 and they extend generally parallel to one another in the longitudinal direction L. In a heating surface area 227, which is located opposite the reception means 4 and the heating projections 208, a contact heating surface 222 is formed on the heating body 202. The contact heating surface 222 has attached thereto an electric component 23 which is to be heated by contact.

By means of the contact heating surface 222, the component 23 is heated by contact with the PCB heating component 201, when said PCB heating component 201 is in operation. This has the effect that a part of the thermal energy generated by the heating element 3 is conducted to the component 23 which is to be heated by contact. The rest of the thermal energy is emitted by convection and/or radiation via the heating projections 208, as discussed above in connection with FIGS. 1, 2, 6 and 7. In the assembled state, the component 23 to be heated by contact is secured to the contact heating surface 222 of the heating body 202 with the aid of a fastening means, e.g. a screw 24. The contact heating surface 222 has formed therein a suitable female thread (not shown) for this purpose. Alternatively, also other suitable fastening means, such as rivets, can be used or the component 23 can be connected to the contact heating surface 222 by means of an adhesive.

The component 23 to be heated by contact can, e.g., be an oscillator which, when in operation, is held at a generally constant temperature. Alternatively, an oscillator can, of course, also be arranged as a spaced-apart component 20 and heated by the PCB heating component 1, 101, 201.

Similar to the embodiment shown in FIGS. 1 and 2, the heating element 3 is arranged in the reception means 4 of the heating body 202. In the embodiment shown in FIG. 10, the fastening elements 10 have formed thereon clamping elements 25 which clutch the contact plates 11 of the electrode bodies 6 and are thus secured to the contact plates 11.

The lower closure member 213 can be generally similar to the above-described closure member 13 of FIGS. 1 and 2. The illustrated base 216 of FIG. 10 is substantially rectangular.

Figure 11:
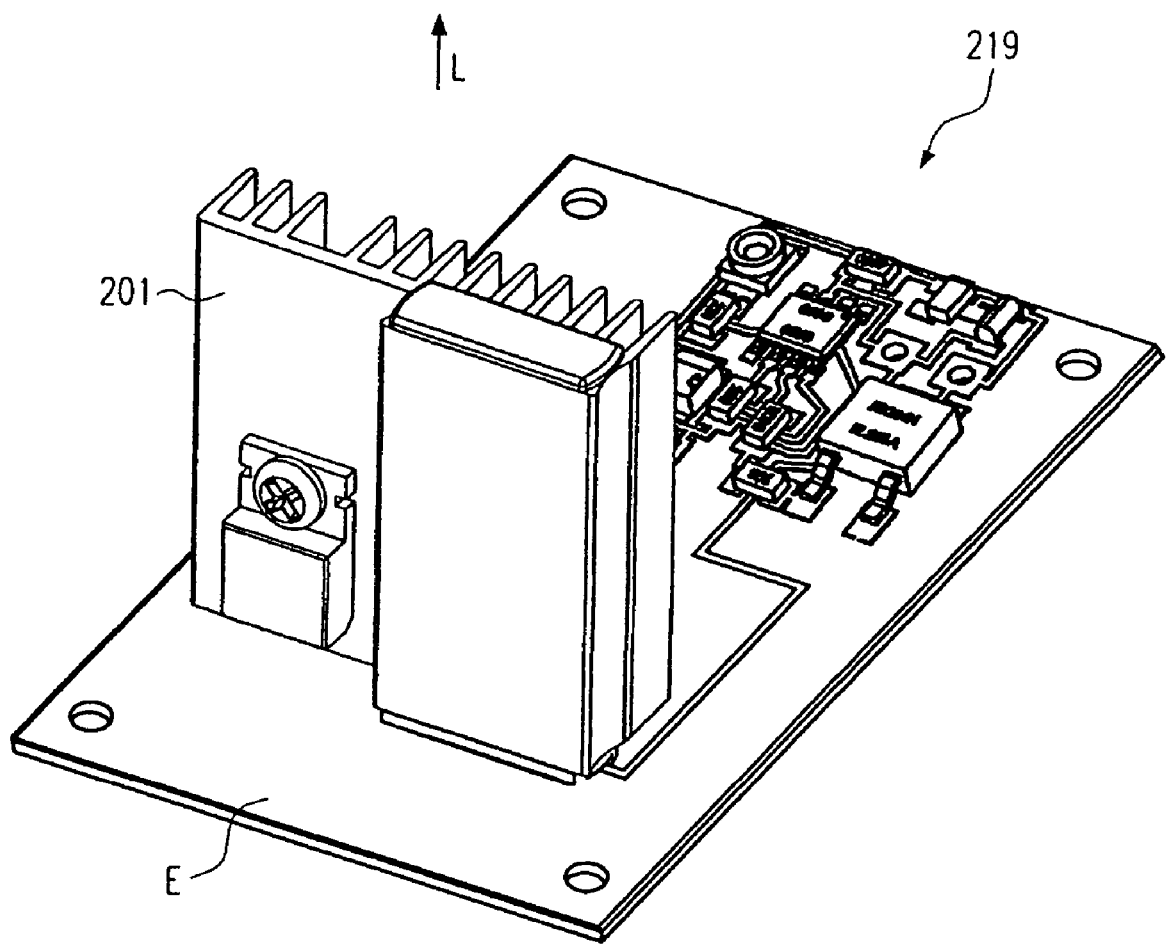
FIG. 11 shows, in a schematic perspective view, an electronic circuit board with the PCB heating component of FIG. 9.

FIG. 11 shows another embodiment of the electronic circuit board 219, which has the PCB heating component 201 of FIGS. 9 and 10 arranged thereon. As for the rest, the embodiment shown in FIG. 11 can be similar or identical to the embodiment of FIG. 3.

The invention claimed is:

1. An electric PCB heating component for heating adjacent units and electric components arranged on an electronic circuit board, the PCB heating component comprising at least one fastening element by which the PCB heating component is attachable to the electronic circuit board, at least one heating element for generating thermal energy, at least one electrically insulating base with which the PCB heating component is adapted to be arranged on the electric circuit board, and at least one heating body which emits via a heat radiating surface the thermal energy generated by the at least one heating element when the PCB heating component is in operation such that the thermal energy heats the electrical components, wherein the at least one heating element is a PTC heating element and the at least one heating body has arranged thereon one or more heating projections, the one or more heating projections configured to effectively enlarge the heat radiating surface such that the thermal energy can be emitted in a substantially directional mode via convection and/or radiation.

2. The electric PCB heating component according to claim 1 wherein the at least one heating body is an extrusion profile.

3. The electric PCB heating component according to claim 1, further comprising circulation passages through which an ambient gas can flow, and the circulation passages being formed between the one or more heating projections.

4. The electric PCB heating component according to claim 1 wherein the at least one heating body includes a receiving section configured to receive and hold the heating element.

5. The electric PCB heating component according to claim 4 wherein the heating element is press-fitted into the receiving section.

6. The electric PCB heating component according to claim 4 wherein the heating element is potted in the receiving section.

7. An electric PCB heating component for heating adjacent units and electric components arranged on an electronic circuit board, the PCB heating component comprising at least one fastening element by which the PCB heating component is attachable to the electronic circuit board, at least one heating element for generating thermal energy, electrically insulating closure members, and at least one heating body which emits via a heat radiating surface the thermal energy generated by the at least one heating element when the PCB heating component is in operation such that the thermal energy heats the electrical components, the at least one heating element is a PTC heating element and the at least one heating body has arranged thereon one or more heating projections, the one or more heating projections configured to effectively enlarge the heat radiating surface such that the thermal energy can be emitted in a substantially directional mode via convection and/or radiation, wherein the at least one heating body includes a receiving section configured to receive and hold the heating element, and the electrically insulating closure members are positioned in opposing ends of the receiving section.

8. The electric PCB heating component according to claim 1 wherein the at least one heating body is formed integrally with at least one electrode body of the heating element.

9. The electric PCB heating component according to claim 1 wherein the at least one fastening element comprises an electric contact element configured to electrically connect to an energy source so as to supply energy from the energy source to the PCB heating component.

10. The electric PCB heating component according to claim 1 wherein the at least one fastening element is formed integrally with an electrode body of the at least one heating element.

11. The electric PCB heating component according to claim 1 wherein the fastening element is a plug connector adapted to be plugged into the electronic circuit board.

12. The electric PCB heating component according to claim 1, further comprising an electric component configured to be heated by conduction and arranged in a thermally conductive manner on a contact heating surface of the PCB heating component.

13. The electric PCB heating component according to claim 1, further comprising a PTC element of the heating element having a limit temperature at which the electrical resistance of the PTC element changes depending on the material forming the PTC element.

14. An electronic circuit board comprising at least one PCB heating component and other electric components, said PCB heating component being configured to heat the other electrical components, at least one fastening element coupling the PCB heating component to the electronic circuit board adjacent the other electrical components, the PCB heating component comprising at least one electrically insulating base and a plurality of elongate projections configured to emit thermal energy in a substantially directional mode, the at least one electrically insulating base being arranged on the electronic circuit board such that, when the PCB heating component is in operation, thermal energy generated by the PCB heating component is transferred directly through heat radiation and/or indirectly through convection via an ambient gas to the electrical components spaced apart from the PCB heating component.

15. The electronic circuit board according to claim 14 wherein the PCB heating component is a preassembled separate structural unit.

16. A method of heating electric components arranged on an electronic circuit board using a PCB heating component comprising at least one electrically insulating base with which the PCB heating component is arranged on said electronic circuit board, a heating element, and a heating body, the method comprising generating thermal energy with the heating element, transferring said thermal energy to the heating body, and transferring the thermal energy, indirectly through convection via an ambient gas and/or directly through heat radiation, from a plurality of heating projections of the heating body to the electrical components.

17. The method of claim 16, wherein the thermal energy is transferred from the heating body in a substantially directional mode.

18. The electric PCB heating component according to claim 1 wherein the at least one heating body comprises means for receiving the heating element.

19. The electronic circuit board according to claim 14, wherein the at least one electrically insulating base is sandwiched between a heating element of the PCB heating component and the electronic circuit board.

20. The method of claim 16, wherein the at least one electrically insulating base is sandwiched between the heating element generating thermal energy and the electronic circuit board.

* * * * *